United States Patent [19]

Kawada et al.

[11] Patent Number: 5,350,720

[45] Date of Patent: Sep. 27, 1994

[54] TRIPLE-LAYERED CERAMIC HEATER

[75] Inventors: Nobuo Kawada; Yoshihiro Kubota; Kesazi Harada; Kenji Itou, all of Gunma, Japan

[73] Assignee: Shin-Etsu Chemical Co., Ltd., Tokyo, Japan

[21] Appl. No.: 45,934

[22] Filed: Apr. 12, 1993

Related U.S. Application Data

[63] Continuation-in-part of Ser. No. 850,690, Mar. 11, 1992, abandoned.

[30] Foreign Application Priority Data

Mar. 18, 1991 [JP] Japan .................................. 3-078514

[51] Int. Cl.$^5$ ............................................. C04B 35/58
[52] U.S. Cl. ....................... 501/97; 428/698; 219/553
[58] Field of Search ............... 428/408, 446, 698; 501/98, 97, 99, 100; 219/553; 338/308–309; 392/388, 389, 416–418; 118/724–725

[56] References Cited

U.S. PATENT DOCUMENTS

| | | | |
|---|---|---|---|
| 4,264,803 | 4/1981 | Shinko | 219/275 |
| 4,356,152 | 10/1982 | Berkman et al. | 422/248 |
| 4,783,368 | 11/1988 | Yamamoto et al. | 428/408 |
| 4,783,369 | 11/1988 | Sugaya et al. | 408/408 |
| 4,967,058 | 10/1990 | Yamazaki et al. | 219/221 |
| 5,233,166 | 8/1993 | Maeda | 219/552 |
| 5,239,612 | 8/1993 | Morris | 392/389 |
| 5,264,681 | 11/1993 | Nozaki et al. | 219/544 |

*Primary Examiner*—Karl Group
*Assistant Examiner*—A. Wright
*Attorney, Agent, or Firm*—McAulay Fisher Nissen Goldberg & Kiel

[57] ABSTRACT

An improved double-layered ceramic heater, which is used for heating a semiconductor silicon wafer mounted thereon in the processing of semiconductor devices, is proposed to be freed from the problems in the prior art ceramic heaters in respects of service life and contamination of silicon wafers mounted thereon. Different from conventional ceramic heaters having a ceramic substrate plate of, for example, boron nitride provided with a heater element layer of a metal foil, the inventive ceramic heater has a substrate plate of silicon nitride and a heater element layer of graphite is formed thereon by the CVD method so that the ceramic heater is not responsible for contamination of semiconductor silicon by virtue of absence of any element which can be a disturbing dopant of the semiconductor. The problem of contamination with carbon can be solved by further providing a coating layer of silicon nitride by the CVD method.

3 Claims, No Drawings

TRIPLE-LAYERED CERAMIC HEATER

BACKGROUND OF THE INVENTION

This is a continuation-in-part application from a copending U.S. patent application Ser. No. 07/850,690 filed Mar. 11, 1992 now abandoned.

The present invention relates to a double-layered ceramic heater or, more particularly, to a double-layered ceramic heater suitable for heating of a semiconductor silicon wafer by mounting the same thereon in the processing of semiconductor devices.

In some steps of the manufacturing process of semiconductor devices, semiconductor silicon wafers are kept at an elevated temperature as mounted on a plate heater. Several types of plate heaters are proposed and under practical use in the prior art, of which so-called ceramic heaters are the most widely used. Ceramic heaters in general have a structure in which a substrate plate made from a sintered ceramic material of alumina, aluminum nitride, zirconium oxide and the like is provided with an electric heater element which is a wire or foil of a metal having a high melting point such as molybdenum, tungsten and the like bonded to or wound around the substrate. These ceramic heaters have several problems and disadvantages. For example, the durability of them is not always long enough because the heater element made from a metal is subject to deformation or rendered brittle by repeating the cycles of heating and cooling. Another problem in conventional ceramic heaters is that, since the substrate plate of a sintered ceramic material is prepared by using a binder in order to promote sintering, the binder contained in the substrate sometimes causes contamination of the semiconductor silicon wafer under processing resulting in a decrease in the quality of the semiconductor devices processed by heating thereon. A further problem is that the cost for the preparation of such a ceramic heater is relatively high due to the complicate assemblage works for the manufacture thereof.

In view of the above described problems and disadvantages in the conventional ceramic heaters, a ceramic heater of an improved type has been developed in which the substrate plate is formed from boron nitride produced by the pyrolytic method and the heater element is provided thereon in the form of a layer of carbon deposited by the pyrolysis of a carbon-containing compound. Although the ceramic heater of this type is advantageous in respect of the long life owing to the use of a non-metallic heater element and the relatively easy assemblage works owing to the integrated structure of the substrate plate and the heater element, serious drawbacks are sometimes caused in the quality of the semiconductor devices processed by using the same due to the use of boron nitride as the material of the ceramic substrate. Namely, boron nitride contains boron as one of the constituting elements, which can be a dopant element in the semiconductor silicon conventionally used for controlling the conductivity and types of semiconductivity of the semiconductor silicon so that, once the semiconductor silicon wafer is contaminated with boron, diffusion of the boron contaminant may proceed at an elevated temperature into the body of the silicon wafer resulting in an uncontrollable alteration of the dopant concentration therein and occurrence of stacking faults in the silicon wafer though dependent on the concentration of the diffused boron.

SUMMARY OF THE INVENTION

The present invention accordingly has an object to provide a novel and improved double-layered ceramic heater which is easy in preparation, has a long life for service and is free from the problem of contamination of the silicon wafer heated therewith.

Thus, the double-layered ceramic heater of the present invention comprises, as an integral body:

(a) a substrate plate made from silicon nitride; and (b) a layer of graphite formed on at least one surface of the substrate plate to serve as a heater element layer.

Preferably, the heater element layer of graphite on the surface of the substrate plate is formed by the method of chemical vapor-phase deposition.

Though optional, the above defined double-layered ceramic heater is further provided with:

(c) a coating layer of silicon nitride formed on the surface of the heater element layer of graphite.

DETAILED DESCRIPTION OF THE PREFERRED EMBODIMENTS

As is described above, the ceramic heater of the invention has a double-layered structure consisting of: (a) a substrate plate made from silicon nitride and: (b) a heater element layer made from graphite. Since the ceramic heater is formed entirely from the elements including silicon, nitrogen and carbon, none of which can be a dopant element in semiconductor silicon wafers, the inventive ceramic heater is absolutely free from the troubles caused by the contamination of the silicon wafer with a contaminant element such as boron and the like belonging to the Group III and phosphorus, arsenic and the like belonging to the Group V of the Periodic Table to act as a disturbing dopant in semiconductor silicon. Moreover, the ceramic heater of the invention can be prepared easily and at low costs since the heater element layer of graphite can be formed by the chemical vapor-phase deposition (CVD) method. Different from conventional metallic heater element, the inventive ceramic heater having a heater element layer of graphite is free from the problem of deformation of or appearance of brittleness in the heater element.

The substrate plate of the inventive double-layered ceramic heater is made from silicon nitride which is known as a kind of ceramic materials. The method for the preparation of silicon nitride is not particularly limitative including a method in which a powder of silicon is heated in an atmosphere of nitrogen gas at a temperature of 1200° C. or higher to give a powder of silicon nitride which can be shaped into the form of a desired substrate plate by a suitable method such as sintering. Alternatively and preferably, however, quite satisfactory substrate plate of silicon nitride can be prepared by the CVD method in which a chlorine compound of silicon such as silicon tetrachloride and ammonia in the vapor phase are thermally decomposed together under a reduced pressure at a temperature of 1400° C. or higher so as to deposit silicon nitride on the surface of a base plate of a suitable material such as graphite.

It is of course that the form and dimensions of the substrate plate of silicon nitride depend on the particular application of the double-layered ceramic heater prepared by using the substrate plate. Since the principal use of the ceramic heater is to heat a circular semiconductor silicon wafer mounted thereon, the substrate plate usually has a form of a circular disc of which the diameter should be somewhat larger than the diameter of the silicon wafer to be mounted on the ceramic heater ranging from 1 inch to 5 inches or even larger. The thickness of the substrate plate is in the range from 0.1 to 10 mm depending on the particular application of the ceramic heater. When the thickness is too small, the ceramic heater cannot be imparted with sufficiently high mechanical strengths while, when the thickness is too large, the ceramic heater cannot meet the requirement for rapid heating and rapid cooling due to the excessively large heat capacity of the substrate plate in addition to the disadvantage due to the large weight as a matter of course.

The heater element layer on at least one surface of the substrate plate of silicon nitride is formed from graphite. Though not limitative but in view of the requirement that the heater element layer should be in direct and firm contact with the surface of the substrate plate, it is preferable that the heater element layer of graphite is formed by the chemical vapor-phase deposition (CVD) method on to the substrate surface. The CVD method for the deposition of graphite is well known in the art as disclosed, for example, in Chem. Phys. Carbon, volume 11, page 69 (1973).

When a heater element layer of graphite is to be formed by the CVD method, for example, a hydrocarbon compound such as methane, ethane and the like in a gaseous form is introduced under a reduced pressure into a CVD chamber containing the substrate plate of silicon nitride which is heated therein at a temperature of 1250 ° C or higher so that the hydrocarbon compound is thermally decomposed to form graphite which is deposited on the surface of the substrate forming a layer. This process is continued until the layer of the deposited graphite may have a desired thickness. The heater element layer of graphite thus deposited on the surface of the substrate plate should have a thickness in the range from 0.5 to 500 $\mu$m depending on the desired surface resistivity of the layer.

The double-layered ceramic heater of the invention prepared in the above described manner is constituted from the elements of silicon, nitrogen and carbon so that the semiconductor device processed by using the ceramic heater is absolutely safe from the troubles due to contamination of the semiconductor silicon wafer with an element which can be a dopant of semiconductor silicon. When it is further desired to prevent contamination of the semiconductor device processed by using the ceramic heater with carbon originating in the heater element layer which is formed from graphite, it is a possible way to provide a coating layer of silicon nitride on all-over the surface of the heater element layer so as to prevent direct contacting of the silicon wafer with the surface of the heater element layer. The coating layer of silicon nitride should have a thickness in the range from 5 to 50 $\mu$m. When the thickness of the coating layer is too small, the desired effect of contamination prevention would be insufficient. When the thickness is too large, on the other hand, a delay is caused in the transfer of heat from the heater element layer to the silicon wafer mounted thereon. The coating layer of silicon nitride can be formed in substantially the same manner as in the formation of the substrate plate of silicon nitride by the CVD method.

In the following, the double-layered ceramic heater of the present invention is described in more detail by way of examples.

EXAMPLE 1

Vapor of silicon tetrachloride and ammonia gas as a mixture were introduced into a chamber for chemical vapor-phase deposition, in which a graphite plate was heated at a temperature of 1400° C., at a constant flow rate under partial pressures of 1 Torr and 4 Torr, respectively, and heated therein for 20 hours so that they are reacted to form silicon nitride which was deposited on the surface of the graphite plate to form a layer having a thickness of 1 mm from which a disc having a diameter of 80 mm was prepared by mechanically removing the graphite plate to serve as a substrate plate of a double-layered ceramic heater. This substrate plate of silicon nitride was placed in a CVD chamber and methane gas was introduced into the chamber holding the silicon nitride disc heated therein at 1700° C. under a reduced pressure of 8 Torr so that the methane gas was thermally decomposed to deposit graphite on the surface of the silicon nitride disc as the substrate plate. This process of chemical vapor-phase deposition was continued for 3 hours until the thickness of the thus deposited graphite layer had reached 12 $\mu$m to give a double-layered ceramic heater. which was then provided with spiral-formed electrodes by mechanical working.

In the next place, a semiconductor silicon wafer of 4 inches diameter was mounted on this double-layered ceramic heater and heated at a temperature of 1000° C. so as to conduct epitaxial growth of silicon on the surface of the silicon wafer. The thus obtained silicon wafer after the epitaxial growth was examined for the dopant concentration to find absolutely no alteration in the concentration of the boron dopant and in the number of the stacking faults in the silicon wafer which was as small as 1.6 per cm$^2$.

For comparison, the same test as above was undertaken by using a conventional ceramic heater having a substrate plate of pyrolytic boron nitride to find a 7% increase in the concentration of the boron dopant in the silicon wafer.

EXAMPLE 2

A disc of silicon nitride having a diameter of 110 mm and a thickness of 1 mm as prepared in a similar manner to Example 1 was held in a CVD chamber into which methane gas was introduced under a reduced pressure of 8 Torr while the silicon nitride disc was heated therein at 1700° C. so that the methane was thermally decomposed to form graphite which was deposited on the surface of the silicon nitride disc as the substrate plate to form a layer of graphite having a thickness of 12 $\mu$m. A coating layer of silicon nitride having a thickness of 10 $\mu$m was formed on the surface of the graphite layer as the heater element layer in the same manner as in Example 1 to give a finished ceramic heater.

A semiconductor silicon wafer having a diameter of 4 inches was mounted on the thus prepared ceramic heater and subjected to epitaxial growth of silicon in substantially the same manner as in Example 1 to find absolutely no alteration in the concentration of the boron dopant in the semiconductor silicon. The number of the stacking faults in the silicon wafer was only 0.8 per cm$^2$.

I claim:

1. A triple-layered ceramic heater which is an integral body comprising:
   (a) a substrate plate made from silicon nitride having a thickness in the range from 0.1 to 10 mm;

(b) a layer of graphite having a thickness in the range from 0.5 to 500 μm form on at least one surface of the substrate plate to serve as a heater element layer; and (c) a coating layer of silicon nitride formed by the chemical vapor-phase deposition method and having a thickness in the range from 5 to 500 μm formed on the surface of the heater element layer of graphite.

2. The triple-layered ceramic heater as claimed in claim 1 in which the substrate plate of silicon nitride is formed by the chemical vapor-phase deposition method.

3. The triple-layered ceramic heater as claimed in claim 1 in which the layer of graphite as a heater element layer is formed by the chemical vapor-phase deposition method.

* * * * *